United States Patent
Marsh

(10) Patent No.: US 9,086,985 B2
(45) Date of Patent: Jul. 21, 2015

(54) UNPOWERED DATA-TRANSFER DEVICE

(71) Applicant: Honeywell International Inc., Morristown, NJ (US)

(72) Inventor: Brian Marsh, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 52 days.

(21) Appl. No.: 13/943,559

(22) Filed: Jul. 16, 2013

(65) Prior Publication Data
US 2015/0026370 A1    Jan. 22, 2015

(51) Int. Cl.
*G06F 13/12*    (2006.01)
*G06F 13/10*    (2006.01)

(52) U.S. Cl.
CPC .................... *G06F 13/102* (2013.01)

(58) Field of Classification Search
CPC .................................................. G06F 13/102
See application file for complete search history.

(56) References Cited

U.S. PATENT DOCUMENTS

| | | | | |
|---|---|---|---|---|
| 2002/0059542 A1* | 5/2002 | Debling | | 714/28 |
| 2004/0222305 A1* | 11/2004 | Leaming | | 235/492 |
| 2005/0240919 A1* | 10/2005 | Kim et al. | | 717/168 |
| 2006/0009879 A1* | 1/2006 | Lynch et al. | | 700/245 |
| 2008/0098380 A1* | 4/2008 | Klusmeyer | | 717/168 |
| 2011/0040960 A1 | 2/2011 | Deierling et al. | | |
| 2012/0288283 A1* | 11/2012 | Meyer et al. | | 398/115 |
| 2013/0115821 A1 | 5/2013 | Golko et al. | | |
| 2013/0122754 A1 | 5/2013 | Golko et al. | | |
| 2013/0149911 A1 | 6/2013 | Golko et al. | | |

* cited by examiner

*Primary Examiner* — Henry Tsai
*Assistant Examiner* — Jing-Yih Shyu
(74) *Attorney, Agent, or Firm* — Craige Thompson; Thompson Patent Law

(57) ABSTRACT

Apparatus and associated methods relate to an unpowered data-transfer device having a processor, non-volatile memory, and two connection ports, from which operating current for the unpowered data-transfer device is drawn when connected to a powered system via one of the connection ports. In various embodiments, the apparatus may transfer program data or configuration data from a host processor system to one of a plurality of target data-transferable systems. Some embodiments may transfer stored data from one or more target data-transferable systems to a host processor system. Some exemplary unpowered data-transfer devices may include a power arbiter coupled to both a host port and a target port, the power arbiter determining from which port operating current may be drawn. In various embodiments, an unpowered data-transfer device may facilitate firmware upgrades or system settings changes to autonomous programmable systems by touching target port contacts to a port on a data-transferable system.

15 Claims, 7 Drawing Sheets

UNPOWERED DATA-TRANSFER DEVICE

TECHNICAL FIELD

Various embodiments relate generally to data-transfer devices, specifically those data-transfer devices that have no battery or other such power source.

BACKGROUND

Data is transferred using a wide variety of media and using a large array of hardware. Data is transferred in a wireless fashion and in a hard-wired fashion. People carry data in memory cards and memory sticks. Such data storage devices typically have a single connector type for facilitating the transfer of data to and from the device. Many electronic systems routinely need firmware upgrades or configuration parameter changes. Such upgrades and parameter modifications may be performed remotely if the electronic system is connected to a network, as are many such systems these days. But a great many electronic systems are autonomous. These stand-alone systems thus require data transfers to be performed at the location where the electronic system resides or require the electronic systems to be sent to a manufacturer or service center for upgrade. Upgrading or modifying autonomous systems can therefore be time consuming or expensive. Some industries may have hundreds of identical autonomous systems, such as in a food processing facility or in a brewery. If such a facility requires system upgrade, the entire process line may have to be temporarily suspended, or duplication of equipment may be required. Upgrading such a large number of identical systems can be cost prohibitive.

SUMMARY

Apparatus and associated methods relate to an unpowered data-transfer device having a processor, non-volatile memory, and two connection ports, from which operating current for the unpowered data-transfer device is drawn when connected to a powered system via one of the connection ports. In various embodiments, the apparatus may transfer program data or configuration data from a host processor system to one of a plurality of target data-transferable systems. Some embodiments may transfer stored data from one or more target data-transferable systems to a host processor system. Some exemplary unpowered data-transfer devices may include a power arbiter coupled to both a host port and a target port, the power arbiter determining from which port operating current may be drawn. In various embodiments, an unpowered data-transfer device may facilitate firmware upgrades or system settings changes to autonomous programmable systems by touching target port contacts to a port on a data-transferable system.

Various embodiments may achieve one or more advantages. For example, some embodiments may transfer preconfigured program data or system parameters automatically when an exemplary unpowered data-transfer device is touched to a target programmable system. A host processor system may preconfigure the desired transfers, both to target systems and from target systems, such that when an operator simply touches the unpowered data-transfer device to a target system's port, all preconfigured transfers may be automatically performed. Some embodiments may provide a visual or audible signal indicative of a successful transfer of data. Such a feedback signal may minimize the time an operator need make contact with a target system. An exemplary unpowered data-transfer system may be preconfigured by a host processing system to upgrade the firmware of multiple target systems, for example. A user may carry an exemplary unpowered data-transfer device from target system to target system touching each system for a brief moment, to transfer system data, for example. In some embodiments, data stored in the target systems may be collected by an exemplary unpowered data-transfer device and subsequently loaded into a host processor system. Stored data may include logged parameters, for example. Such collected data may facilitate the scheduling of maintenance, for example.

Unpowered data-transfer devices may be easily carried, being small in size and light in weight. Having no power source in such a data-transfer device may eliminate the need for the carrying of power supplies, or the need for power outlets to be located in the vicinity of each target device. Even target systems that are located in inconvenient places need but a momentary touch for such data transfers. An operator may be able to simply harvest logged information from many stand-alone systems without the need to carry heavy or self-powered equipment. An operator may simply walk from system to system momentarily touching each to perform firmware updates or system reconfigurations, while simultaneously collecting logged data. The operator can then return to the host processor system to upload all of the harvested data. The host processor system may then immediately inform the operator of missed target systems, or urgent maintenance needs.

Many exemplary unpowered data-transfer devices have little or no infrastructure requirements for secure data-transfer operations. There may be no need for sophisticated encoding as may be required for wireless data transfers. A direct mechanical connection between an unpowered data-transfer device and a target system may initiate the transfer. Connecting wires are not needed, precluding connector failures, such as broken pins, frayed wires, bent contacts, etc. In various embodiments, the programmed data transfer may be specific for desired transfer operations which may be particular for each target system. And each specific operation may be programmed into the unpowered data-transfer device, which then may automatically perform such operation when touched to the target. Thus, many communications infrastructures may be eliminated. No Bluetooth support may be required. Nor may be required Ethernet protocols, or Wi-Fi equipment, for example. No support for internet or Firewire may be needed, etc. This, in turn, may dramatically reduce the cost of some exemplary devices, as licenses for such non-required protocols may be forgone. And the additional support hardware for such protocols need not be purchased.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, an exemplary application of an unpowered data-transfer device is briefly introduced with reference to FIG. 1. Second, with reference to FIG. 2, the discussion turns to an exemplary embodiment that illustrates an exemplary form factor of an unpowered data-transfer device. Then, with reference to FIG. 3, a block diagram depicting exemplary architectures of an unpowered data-transfer device and related systems which may interface with such a device. Finally, with reference to FIGS. 4-7, the discussion details an exemplary method of using an unpowered data-transfer device.

Figure 1:
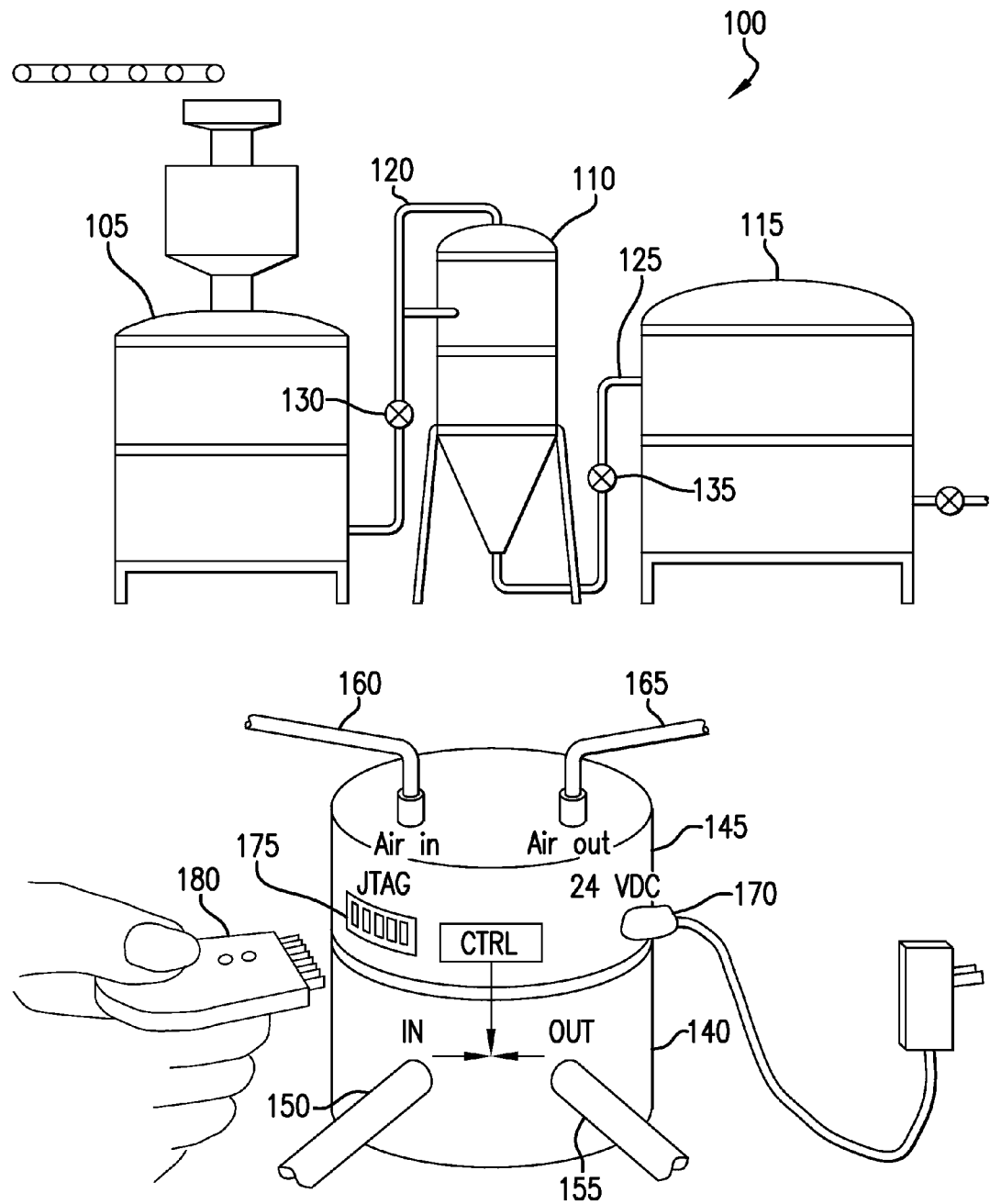
FIG. 1 depicts an industrial setting in which an exemplary unpowered data-transfer device is used.

FIG. 1 depicts an industrial setting in which an exemplary unpowered data-transfer device is used. In this figure, a brewery 100 is depicted with various beer processing equipment. The figure depicts various processing tanks 105, 110, 115 connected to each other via transport pipes 120, 125. The transport pipes 120, 125 are shown having valve systems 130, 135 which may control the flow of the contents from one processing tank 105, 110 to another processing tank 110, 115 by opening or closing a valve 140 by a valve controller 145. The valve 140 is depicted as having an input port 150 and an output port 155. The exemplary valve controller 145 is depicted having an input air line 160 and an output air line 165. This exemplary embodiment may use pneumatic air pressure to actuate the valve 140. The valve controller 145 is also depicted having a DC power input 170 and a JTAG (Joint Test Action Group) port 175. An exemplary unpowered data-transfer device 180 is shown being inserted into the JTAG port 175 of the valve controller 145.

An operator may use an unpowered data-transfer device 180 to upgrade the firmware of the valve controller 145, for example. Other operations may be possible using the exemplary unpowered data-transfer device 180. In some embodiments, various control settings may be programmed using the unpowered data-transfer device. A valve controller 145 may store a log of its operations along with a time-stamp of each operation. A valve controller may likewise store operation error information in its memory. This log or error information, for example, may be downloaded to an unpowered data-transfer device. These data may subsequently be transferred to a host processor system, along with similar data from collected from other valve controllers. These data may be used for statistical process control purposes or for maintenance purposes, for example.

Figure 2:
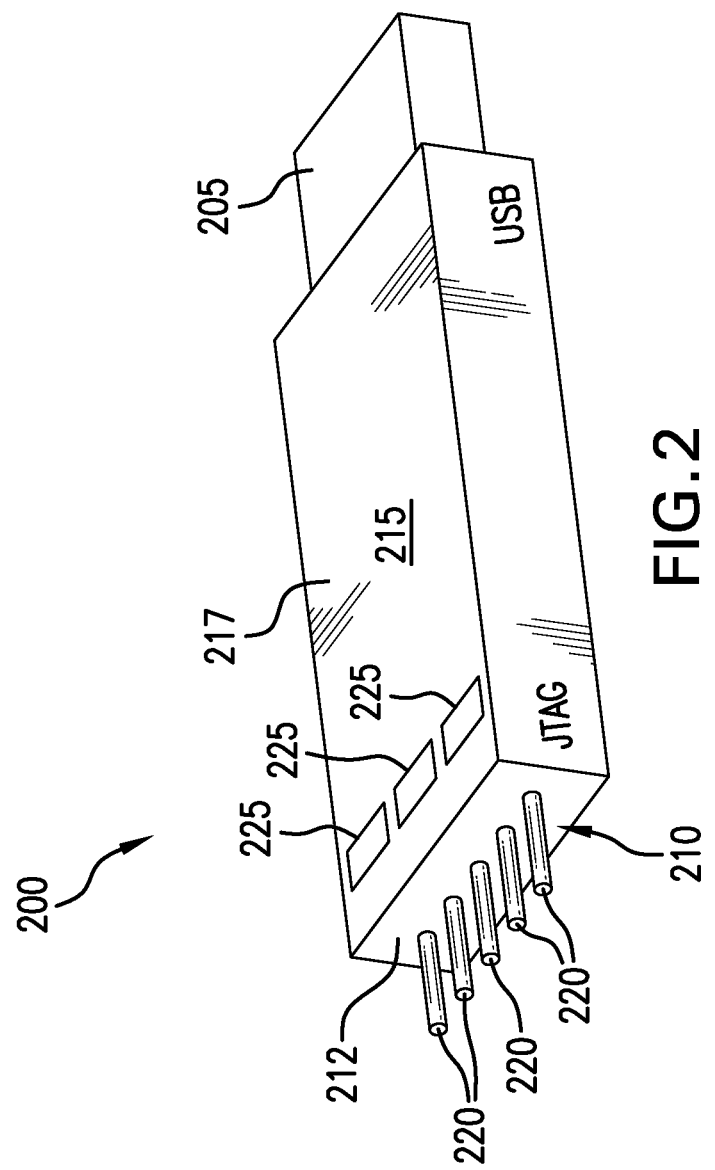
FIG. 2 depicts a perspective view of an exemplary unpowered data-transfer device.

FIG. 2 depicts a perspective view of an exemplary unpowered data-transfer device. In this figure an unpowered data-transfer device 200 is depicted with an exemplary form factor. The unpowered data-transfer device 200 has two electrical connection ports 205, 210. A USB port 205 projects from a host aperture (not depicted) on one end of a KEYFOB type housing 215. A JTAG port 210 projects from a target aperture 212 on an opposite end of the KEYFOB type housing 215. The housing 215 has a grip portion 217 between the JTAG port 210 and the USB port 205. In this exemplary embodiment, the JTAG port 210 is shown having five pins 220. Each pin 220 may be a spring-loaded pogo-style pin. Is such an embodiment, the pogo pins 220 may facilitate the unpowered data-transfer device 200 to simply be touched to a corresponding series of electrical landing pads for communications between the unpowered data-transfer device 200 and a target system. A series of three LEDs 225 is shown near the JTAG port 210 of the unpowered data-transfer device 200. In some embodiments, one of the LEDs 225 may indicate that a successful communication has been achieved between the unpowered data-transfer device 200 and a target system. Various embodiments may use an LED to indicate that operating current is being drawn from a target device. In some embodiments one of the LEDs 225 may indicate that a communication has been unsuccessful between an unpowered data-transfer device 200 and a target system, for example.

Figure 3:
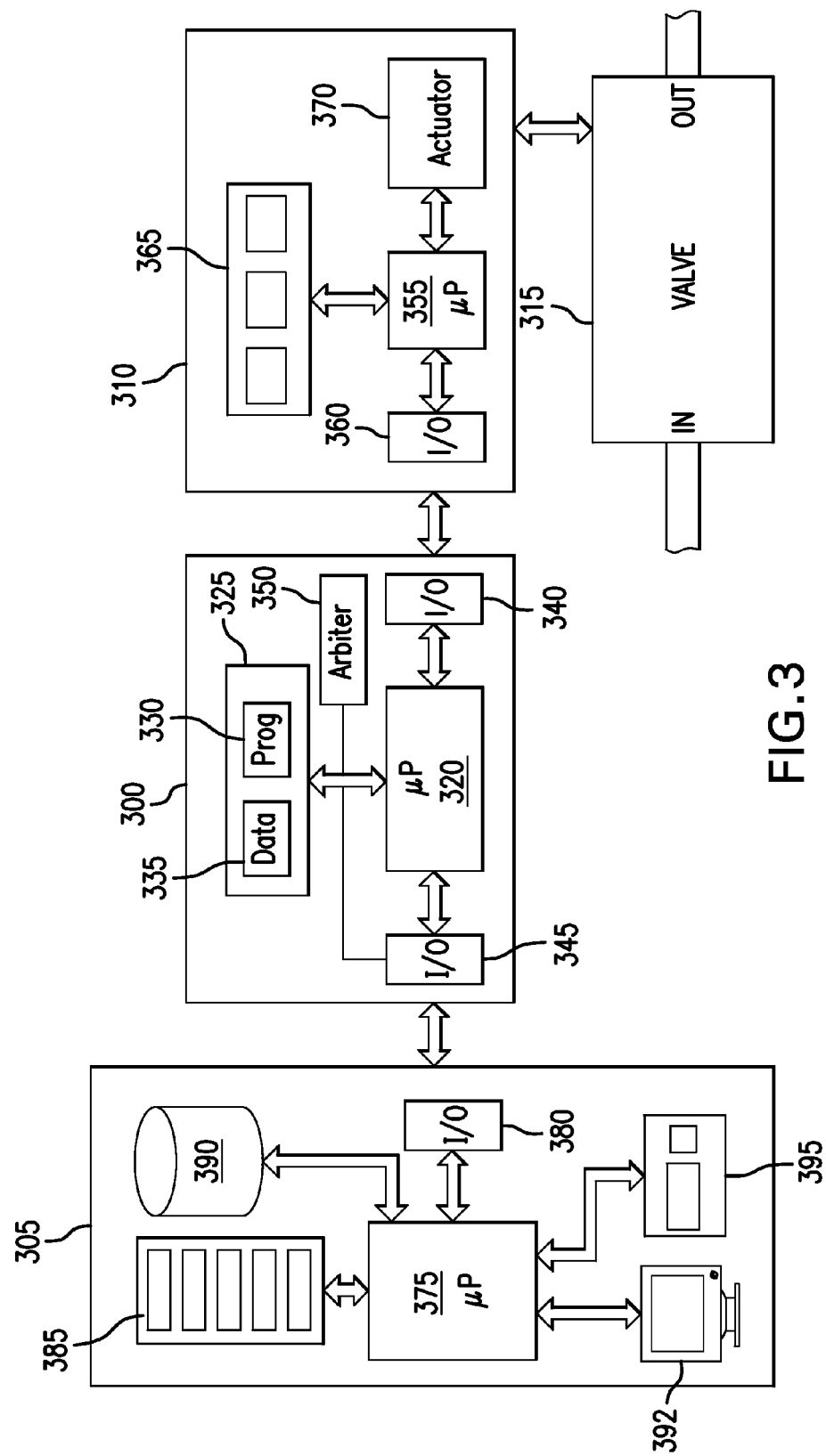
FIG. 3 depicts a block diagram of an exemplary unpowered data-transfer device along with a host processor system and a valve controller.

FIG. 3 depicts a block diagram of an exemplary unpowered data-transfer device along with a host processor system and a valve controller. In this figure, an exemplary unpowered data-transfer device 300 is shown in relation to an exemplary host processor system 305 and an exemplary target valve controller 310. The target valve controller 310 is shown connected to a valve 315 associated with the target valve controller 310. The unpowered data-transfer device 300 has a microprocessor 320 in this example. Various embodiments may use different types of processors. For example some embodiments may use a microcontroller. In some embodiments an FPGA (field-programmable gate array) may be used. Some embodiments may employ PLDs (Programmable Logic Device), for example. The microprocessor 320 is connected to non-volatile memory 325. The non-volatile memory contains both program-memory locations 330 and data-memory locations 335. The program-memory locations 330 may store the instructions that are executed by the microprocessor 320. In some embodiments, two sets of program instructions may reside in the program-memory locations 330, one set for execution when the unpowered data-transfer device 300 is connected to the host processor system 305, and one set for execution when the unpowered data-transfer device 300 is connected to a target valve controller 310.

The depicted unpowered data-transfer device 300 has a target port interface 340 and a host port interface 345. When the target port interface 340 is connected to a target valve controller 310, an arbiter 350 may set the unpowered data-transfer device 300 into a target mode. In the target mode, the unpowered data-transfer device 300 may draw operating current from the target port interface 340. When the host port interface 345 is connected to a host processor system 305, an arbiter 350 may set the unpowered data-transfer device 300 into a host mode. In the host mode, the unpowered data-transfer device 300 may draw operating current from the host port interface 345. When the unpowered data-transfer device 300 is connected both to a host processor system 305 and to a target valve controller 310, the arbiter may set the unpowered data-transfer device 300 into a host-target mode. In the host-target mode, for example, the unpowered data-transfer device 300 may draw operating current from the host processor system 305.

The FIG. 3 embodiment depicts a target valve controller 310 which includes a microprocessor 355, a JTAG interface 360, a memory block 365, and an actuator 370. The actuator 370 couples to a valve 315. The actuator 370 may be a solenoid in some embodiments. In various embodiments, the actuator 370 may be pneumatic. In some embodiments the actuator 370 may be electric. In some embodiments, the actuator 370 may provide an electric connection the valve 315. In an exemplary embodiment, the actuator 370 may provide a pneumatic connection with the valve 315. In some embodiments the actuator may provide a mechanical connection to the valve 315.

The FIG. 3 embodiment depicts a host processor system 305 which includes a microprocessor 375, a USB interface 380, a memory block 385, a mass storage device 390, a display screen 392, and a keyboard 395. The host processor system 305 may execute instructions that facilitate the data-transfer of information to and from the unpowered data-transfer device 300. The host processor system 305 may execute instructions that support firmware upgrades for various programmable systems. Instructions that manage logged data information from multiple target systems may run on the host processor system 305.

Figure 4:
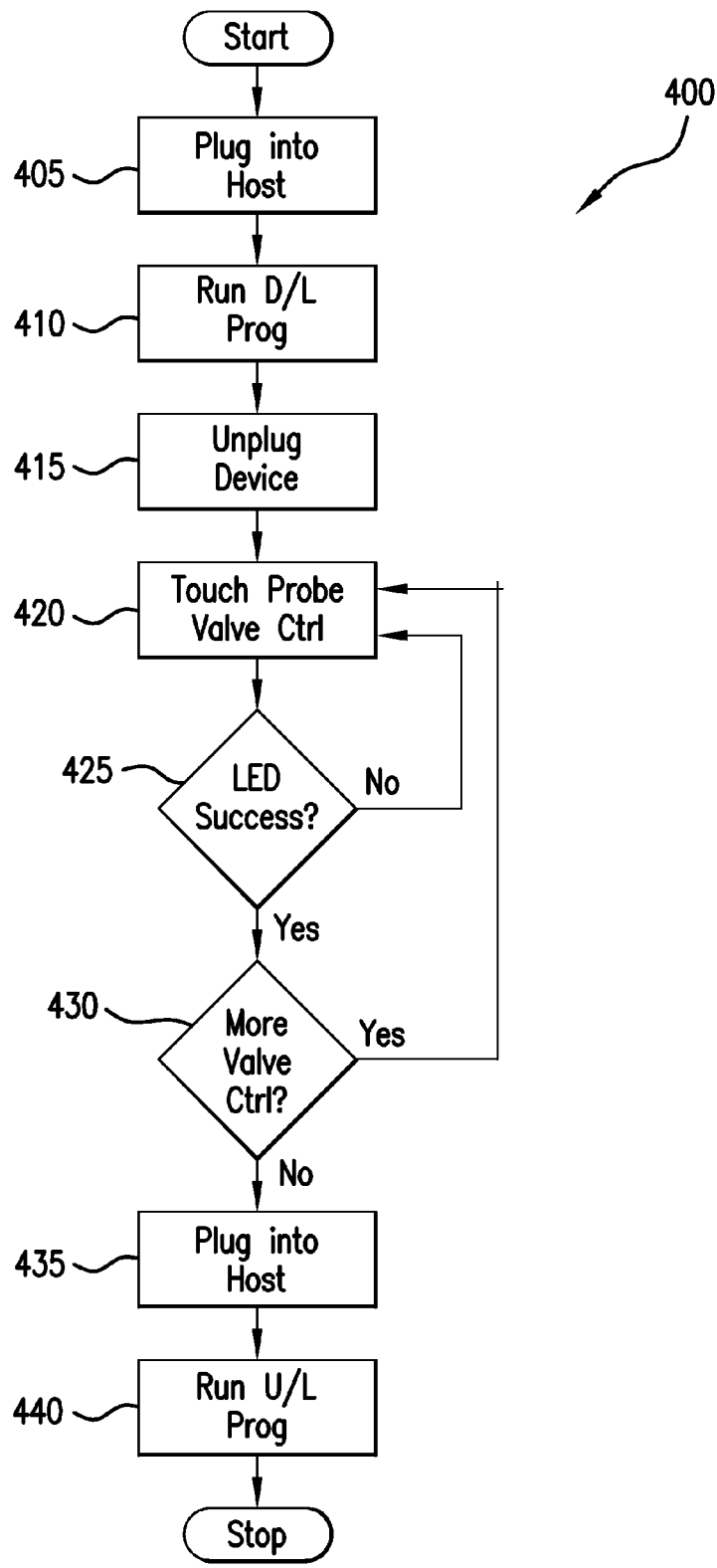
FIG. 4 depicts a flow chart describing an exemplary industrial operational use of an exemplary unpowered data-transfer device.

FIG. 4 depicts a flow chart describing an exemplary industrial operational use of an exemplary unpowered data-transfer device. In this flow chart, an exemplary method 400 of use of an unpowered data-transfer device is depicted. The method 400 is described from the perspective of an operator in a multi-valve-controller facility. The operator first plugs the device into a host processor system's USB port 405. The operator then runs a program that downloads valve-controller program data and control settings from the host processor system to an unpowered data-transfer device 410. The operator then removes the unpowered data-transfer device from the host processor system's USB port 415. The operator then touches the unpowered data-transfer device's JTAG port to a valve controller's JTAG connector 420. The operator then waits for an LED indicator of a successful data transfer 425. If the LED indicates a successful data transfer, the operator proceeds to the next step 430. If the LED does not indicate a successful data transfer, the operator repeats the step 420. The operator then determines whether more valve controllers need a data transfer 430. If more valve controllers need updates or if more valve controller data needs to be collected, the operator moves to the next valve and repeats step 420. If, however, no more valve controllers need updates and no more valve controller data needs to be collected, the operator again plugs the unpowered data-transfer device into the USB port of the host computer system 435. The user then runs a program that uploads the collected data to the host computer 440.

Figure 5:
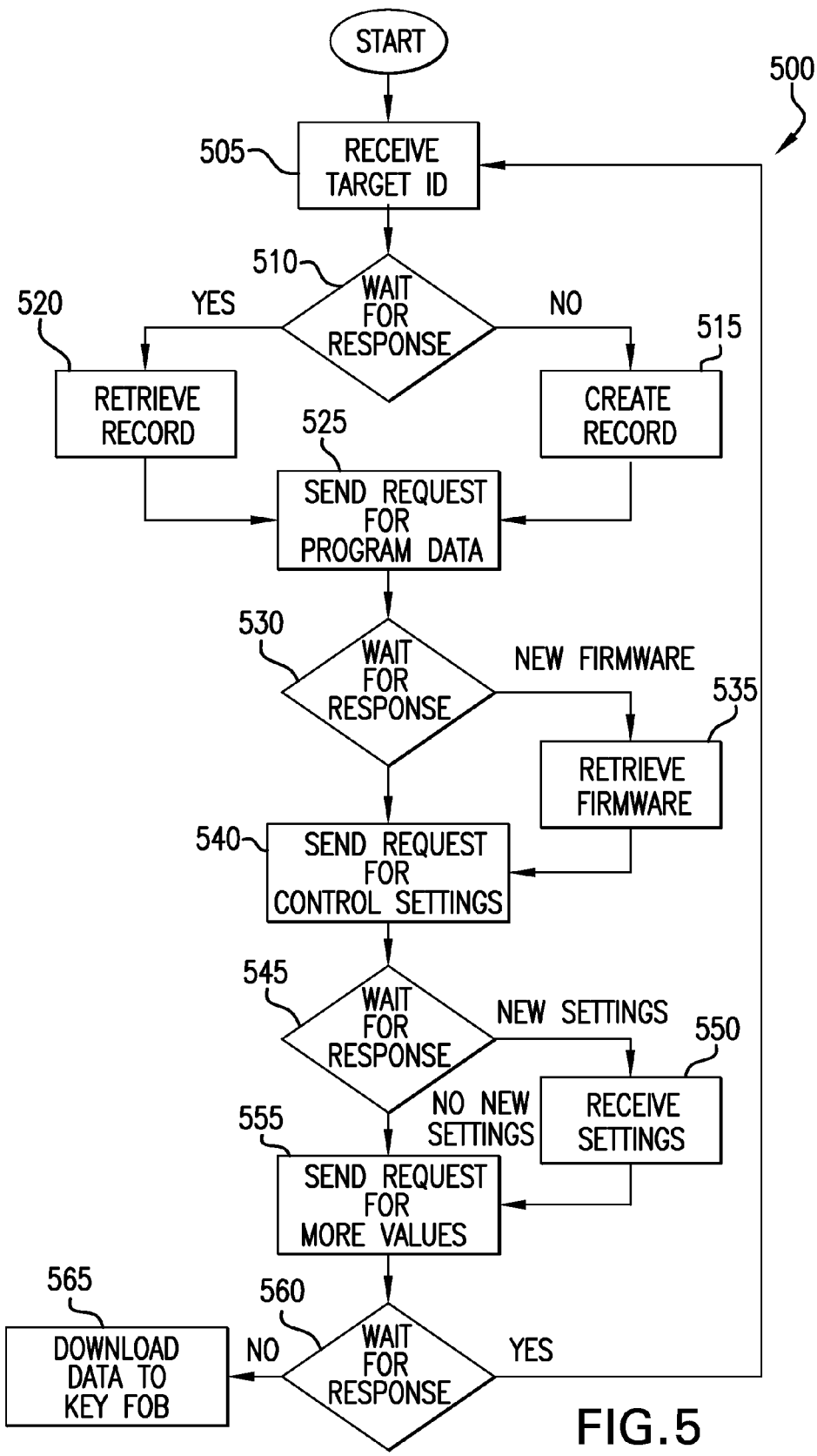
FIG. 5 depicts a flow chart of an exemplary programming communication between a host processor system and an exemplary unpowered data-transfer device.

FIG. 5 depicts a flow chart of an exemplary programming communication between a host processor system and an exemplary unpowered data-transfer device. The flow chart expands the step 410 of the FIG. 4 flowchart in which an operator downloads valve-controller program data and control settings from the host processor system to an unpowered data-transfer device. The exemplary method is described from the vantage point of the processor in the host processor system. The processor first receives target valve identifying information from the operator 505. It then determines if the target valve information has a record 510 in memory or mass storage and waits for a response as in step 510. If no record exists for the identified target valve, the processor creates a record 515. If a record does exist for the identified target valve, the processor retrieves the record from memory or from mass storage 520. The processor then sends a request to the user for valve controller program data via the display 525. The processor then waits for a response from the user via the keyboard 530. If the user indicates that a firmware upgrade is needed for the identified target valve, the processor retrieves the new firmware code from memory or from mass storage 535. If the user does not indicate that a firmware upgrade is needed for this valve, the processor continues to the next step 540. The processor then sends a request to the user for new control settings for the identified target valve 540 via the user display. The processor then waits for a response from the user via the keyboard 545. If the user indicates that new control settings are needed, the processor receives the new settings from the user 550. If, however, the user indicates that no new control settings are needed, the processor continues to the next step 555. The processor then sends the user a request asking if more valves need data transfer 555. The processor then waits for the user to respond 560. If the response is that more valves need data transfer, the processor returns to step 505. If, however, the response is that no more valves need data transfer, the processor downloads all the valves' associated firmware upgrade code and control settings data to the unpowered data-transfer device 565.

Figure 6:
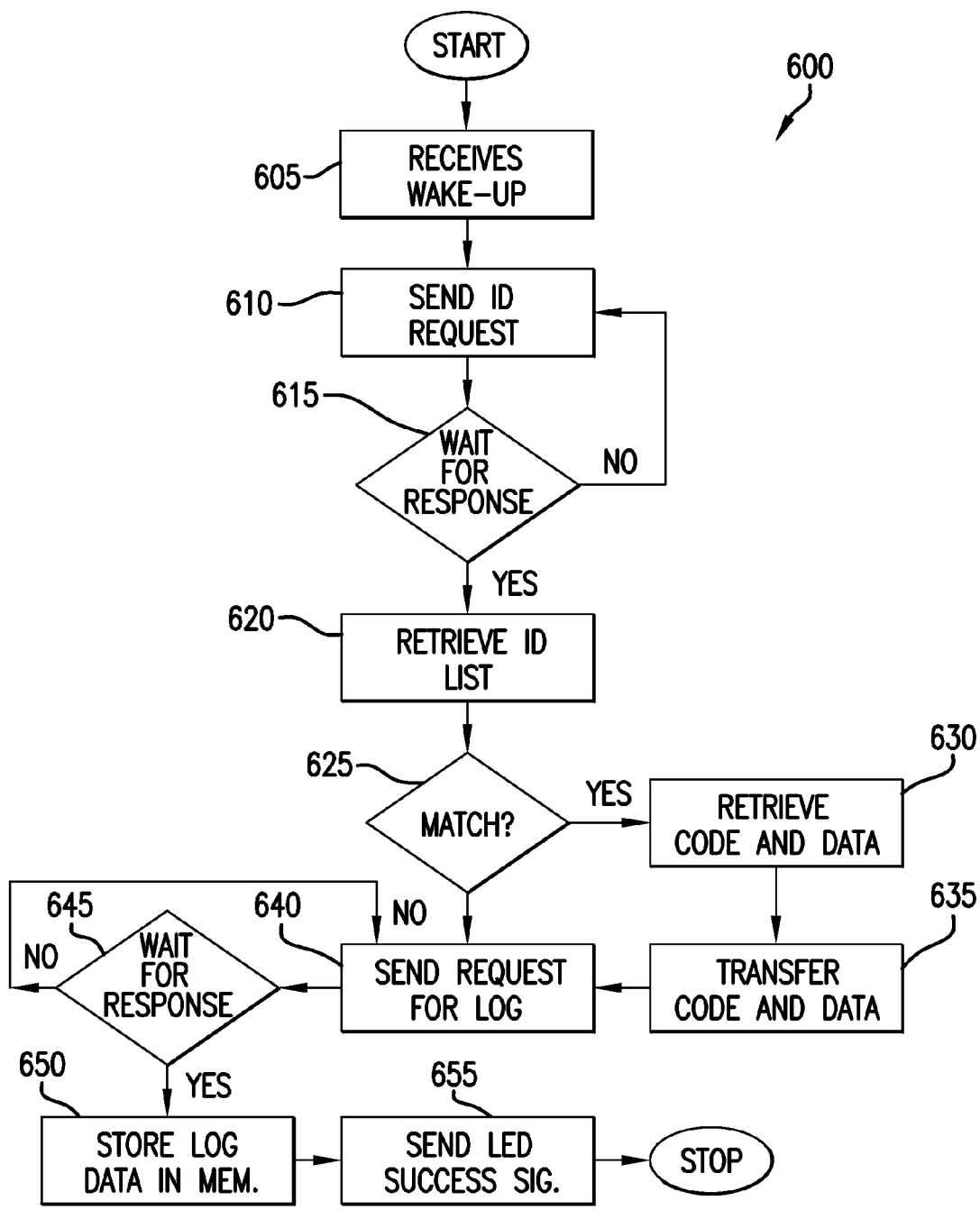
FIG. 6 depicts a flow chart of an exemplary target module communication between an exemplary unpowered data-transfer device and a target module.

FIG. 6 depicts a flow chart of an exemplary target module communication between an exemplary unpowered data-transfer device and a target module. In the FIG. 6 embodiment, the flow chart 600 expands step 420 of the FIG. 4 flowchart in which the operator touches the unpowered data-transfer device's JTAG port to a valve controller's JTAG connector. This exemplary method is described from the perspective of the processor in the unpowered data-transfer device. When operating current is drawn from the JTAG port, the microprocessor receives a wake-up interrupt from a power arbiter 605. The processor then sends a request for target identifying information from the target module 610. The processor then waits for a response from the target module 615. If the target module does not respond, the processor returns to step 610 and resends the request. If the target module does respond, the processor retrieves the list of IDs in its data-memory bank 620. The processor then determines if the ID of the target module matches any of the IDs in its data memory bank 625. If the target ID matches one of the IDs in the data-memory of the unpowered data-transfer device, the processor retrieves the associated firmware code and control settings for that module from the data-memory bank 630. The processor next transfers the firmware code and control settings to the target module connected to the target port 635. The processor then requests the target module to send its logged data to the unpowered data-transfer device 640. If, back at step 625, the target ID did not match any of the IDs in the data-memory, the processor also sends a request for the logged data of the target module 640. The processor then waits for a response from the target module 645. If the target module doesn't respond, the processor resends the request 640. If the target module does send the data, the processor stores the data along with the target's ID in the data-memory bank 650. The process finishes by commanding an LED to signal success 655.

Figure 7:
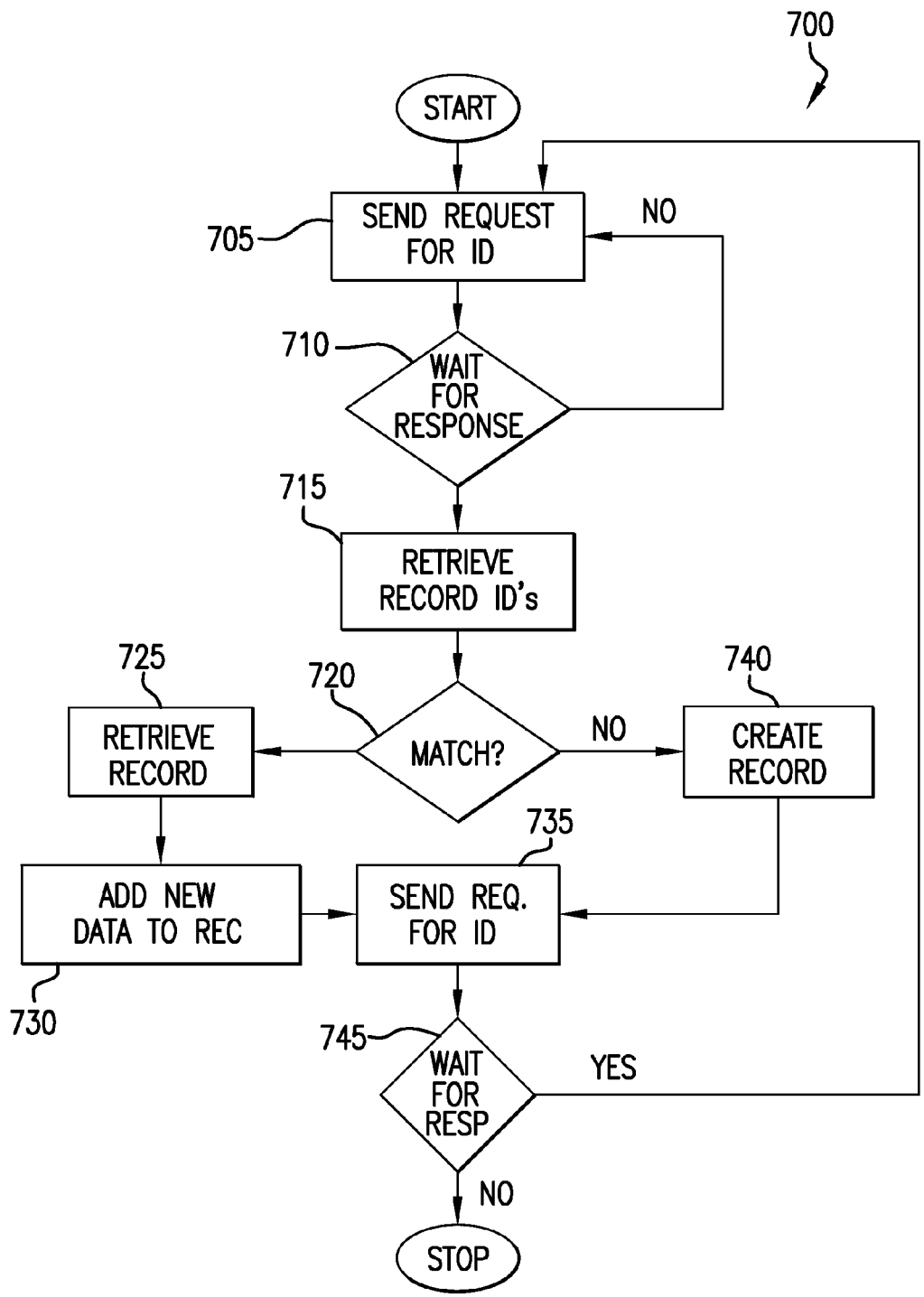
FIG. 7 depicts a flow chart of an exemplary data communication between a host processor system and an exemplary unpowered data-transfer device.

FIG. 7 depicts a flow chart of an exemplary data communication between a host processor system and an exemplary unpowered data-transfer device. The flow chart 700 expands step 440 of the FIG. 4 flowchart, in which a data transfer from the unpowered data-transfer device to the host processor is performed. The FIG. 7 flowchart is given from the perspective of the processor in the host processor system. The processor first sends a request to the unpowered data-transfer device to send a valve record, including valve ID and logged data 705. The processor then waits for a response 710. If the unpowered data-transfer device does not respond, the processor returns to step 705 and sends the request again. If, however, the processor receives a record from the unpowered data-transfer device, the processor then retrieves the IDs from a record database stored in memory or in mass storage 715. The processor then attempts to match the received ID to the record database 720. If the received ID matches one of the IDs in the record database, the processor then retrieves that record associated with the ID from the database 725. The processor then merges the new data into the record from the database and stores the modified record into memory or mass storage 730. If, back at step 720, the received ID does not match one of the IDs in the record database, the processor then creates a record associated with the received ID using the data associated with the ID and stores the record in memory or mass storage 740. The processor then sends a request to the unpowered data-storage device for another record as in step 735 and waits for a response as in step 745. If the processor receives a response that the unpowered data-transfer device has more records, the processor returns to step 705. If the process receives a response that the unpowered data-transfer device has no more records, the processor terminates the method.

Although various embodiments have been described with reference to the figures, other embodiments are possible. For example, various types of target systems or modules may benefit from communications with an unpowered data-transfer device. In some embodiments, the target system may be a valve controller. In an exemplary embodiment the target system may be a camera. In some embodiments, various sensors may be the target systems with which an unpowered data-transfer device may transfer data. Many systems utilize JTAG ports for firmware upgrades and data transfers. One exemplary embodiment may provide universal transfer capability to all JTAG systems that provide support protocol for an exemplary unpowered data-transfer device. For example, one exemplary embodiment may support data exchanges between many different manufacturers of valve controllers, each supporting a five pin JTAG interface. The manufacturer may provide manufacturer specific software to be executed on a universal unpowered data-transfer device which may be loaded into its non-volatile program-memory locations. The universal unpowered data-transfer device may then upgrade the firmware for multiple systems, for example, even though the systems may have been manufactured by different manufacturers and may have different interface protocols.

In some embodiments, the target port may be a universal contact array having multiple connector interfaces. An exemplary connector interface may couple to an exemplary unpowered data-transfer device by way of the universal contact array, and also present a USB connector for use as a host port, for example. Different connector interfaces may support different physical configurations of a system interface. In this way, an unpowered data-transfer device may be capable of interfacing to even more diverse systems. In one exemplary embodiment, only one universal port may be included in an unpowered data-transfer device. But a contact interfaced, may permit the port to be configured as a USB port for the purpose of interfacing with a USB host system, and the port may then be configured as a JTAG port for the purpose of interfacing with various target systems.

Various embodiments may have an audible signal generator for indicating successful data transfers. Some embodiments may have one or more LEDs for indicating the status of a data transfer. An exemplary embodiment may have an LED indicative of the presence of power at one or more of the ports. In an exemplary embodiment, an LCD display may be used to provide the user with status information, for example. Some embodiments may include more than two ports, and thereby support more than two interface protocols.

Various embodiments of unpowered data-transfer devices may include a housing, having a host aperture, a target aperture distinct from the host aperture, and a grip portion. Some embodiments may include a processor within the housing. In an exemplary embodiment the unpowered data-transfer device may include a plurality of non-volatile program-memory locations within the housing and coupled to the processor. Some embodiments may include a plurality of non-volatile data-memory locations within the housing and coupled to the processor. A USB host port may extend from the host aperture and may be configured to couple to a host processor system, wherein the unpowered data-transfer device may be in a host mode when coupled to the host processor. A JTAG target port may extend from the target aperture and may be configured to couple to one of a plurality of target valve controllers each having a serial number, wherein the unpowered data-transfer device may be in a target mode when coupled to a target valve controller. In various embodiments, the unpowered data-transfer device may draw operating current from the host port when in the host mode and may draw operating current from the target port when in the target mode. In some embodiments, the plurality of non-volatile program-memory locations may contain instructions that, when executed by the processor, may cause the processor to perform operations including: a) receiving, when in the host mode, target criteria from the host processor system; b) storing, when in the host mode, the target criteria in a subset of the plurality of non-volatile data-memory locations; c) receiving, when in the target mode, the target serial number from the target valve controller coupled to the target port; d) retrieving, when in the target mode, target criteria from the plurality of non-volatile data-memory locations; and e) comparing, when in the target mode, the received target serial number with the retrieved target criteria to determine a target match. In some embodiments, the plurality of non-volatile program-memory locations may contain instructions that, when executed by the processor, may cause the processor to perform operations including: a) receiving, when in the host mode, firmware data or valve controller settings associated with the target criteria from the host processor system; b) storing, when in the host mode, the firmware data or valve controller settings associated with the target criteria in a subset of the plurality of non-volatile data-memory locations; c) selecting, when in the target mode, the firmware data or valve controller setting associated with the matched target; and d) transmitting, when in the target mode, the selected firmware data or valve controller settings to the target valve controller coupled to the target port.

In various embodiments, an unpowered data-transfer device may include a host port configured to couple to a host processor system, wherein the unpowered data-transfer device may be in a host mode when coupled to the host processor. Some embodiments may include a target port distinct from the host port, the target port configured to couple to one of a plurality of data-transferable systems each having identifying information, wherein the unpowered data-transfer device may be in a target mode when coupled to a data-transferable system. The unpowered data-transfer device may draw operating current from the host port when in the host mode and draws operating current from the target port when in the target mode. In some embodiments, means for drawing operating current either the target port or the host port may be performed by a power arbiter. An exemplary power arbiter may be coupled to both the host port and the target port. An exemplary power arbiter may draw operating current from the host port when in the host mode and drawing operating current from the target port when in the target mode. Some exemplary power arbiters may set a flag indicative of the host mode when drawing operating current from the host port. Some exemplary power arbiters may set a target flag when drawing operating current from the target port.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. An exemplary embodiment may be implemented in a computer system that includes a graphical user interface and/or an Internet browser. To provide for interaction with a user, some implementations may be implemented on a computer having a display device, such as an LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from the source to the receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, Firewire, ATA/IDE, RS-232, RS-422, RS-485, 802.11 a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were replaced or supplemented with other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. An unpowered data-transfer device, comprising:
    a housing, having a host aperture, a target aperture distinct from the host aperture, and a grip portion;
    a processor within the housing;
    a plurality of non-volatile program-memory locations within the housing and coupled to the processor;
    a plurality of non-volatile data-memory locations within the housing and coupled to the processor;
    a USB host port extended from the host aperture and configured to couple to a host processor system, wherein the unpowered data-transfer device is in a host mode when coupled to the host processor system; and,
    a JTAG (Joint Test Action Group) target port extended from the target aperture and configured to couple to one of a plurality of target valve controllers each having a serial number, wherein the unpowered data-transfer device is in a target mode when coupled to a target valve controller,
    wherein the unpowered data-transfer device draws operating current from the USB host port when in the host mode and draws operating current from the JTAG target port when in the target mode,
    wherein the plurality of non-volatile program-memory locations contains instructions that, when executed by the processor, cause the processor to perform operations comprising:
        (a) receiving, when in the host mode, target criteria from the host processor system;

(b) storing, when in the host mode, the target criteria in a subset of the plurality of non-volatile data-memory locations;
(c) receiving, when in the target mode, the target serial number from the target valve controller coupled to the JTAG target port;
(d) retrieving, when in the target mode, target criteria from the plurality of non-volatile data-memory locations; and,
(e) comparing, when in the target mode, the received target serial number with the retrieved target criteria to determine a target match;
wherein the plurality of non-volatile program-memory locations contain instructions that, when executed by the processor, cause the processor to perform operations further comprising:
(f) receiving, when in the host mode, firmware data or valve-controller settings associated with the target criteria from the host processor system;
(g) storing, when in the host mode, the firmware data or valve-controller settings associated with the target criteria in a subset of the plurality of non-volatile data-memory locations;
(h) selecting, when in the target mode, the firmware data or valve-controller setting associated with the matched target; and,
(i) transmitting, when in the target mode, the selected firmware data or valve-controller settings to the target valve controller coupled to the JTAG target port.

2. The unpowered data-transfer device of claim 1, wherein the plurality of non-volatile program-memory locations contain instructions that, when executed by the processor, cause the processor to perform operations comprising:
(a) receiving, when in the target mode, target data from the target valve controller coupled to the JTAG target port;
(b) receiving, when in the target mode, the target serial number associated with the target valve controller coupled to the JTAG target port;
(c) storing, when in the target mode, the target data and the associated target serial number in a subset of the plurality of non-volatile data-memory locations;
(d) retrieving, when in the host mode, target data and the associated target serial number from the plurality of non-volatile data-memory locations; and,
(e) transmitting, when in the host mode, the target data and the associated target serial number to the host processor system.

3. The unpowered data-transfer device of claim 1, wherein the JTAG target port further comprises a plurality of spring-loaded electrically-conductive pins.

4. The unpowered data-transfer device of claim 1, further comprising an LED indicator responsive to a successful data-transfer operation.

5. The unpowered data-transfer device of claim 1, further comprising an audible signal generator responsive to a successful data-transfer operation.

6. The unpowered data-transfer device of claim 1, wherein the unpowered data-transfer device is in a host-target mode when coupled to both a host processor system and a target valve controller.

7. The unpowered data-transfer device of claim 1, wherein the JTAG target port is further configured such that when unpowered data-transfer device is coupled to a target valve controller, a frame of the target port aligns to a frame of the target valve controller, the alignment of the frames to cause registration of the pins of the JTAG target port with corresponding contacts of the target valve controller.

8. The unpowered data-transfer device of claim 1, further comprising a power arbiter coupled to both the USB host port and the JTAG target port, the power arbiter drawing operating current from the USB host port when in the host mode and drawing operating current from the JTAG target port when in the target mode, the power arbiter setting a flag indicative of the host mode when drawing operating current from the USB host port, the power arbiter setting a target flag when drawing operating current from the JTAG target port.

9. The unpowered data-transfer device of claim 8, wherein the plurality of non-volatile program-memory locations contain instructions that, when executed by the processor, cause the processor to perform operations comprising:
(a) retrieving the target flag and host flag from the power arbiter;
(b) executing instructions associated with host mode if the host flag is set; and,
(c) executing instructions associated with target mode if the target flag is set.

10. An unpowered data-transfer device, comprising:
a processor;
a plurality of non-volatile program-memory locations coupled to the processor;
a plurality of non-volatile data-memory locations coupled to the processor;
a host port configured to couple to a host processor system, wherein the unpowered data-transfer device is in a host mode when coupled to the host processor system;
a JTAG (Joint Test Action Group)-target port distinct from the host port, the JTAG target port configured to couple to one of a plurality of data-transferable systems each having identifying information, wherein the unpowered data-transfer device is in a target mode when coupled to a data-transferable system, and,
a power arbiter coupled to both the host port and the JTAG target port, the power arbiter drawing operating current from the host port when in the host mode and drawing operating current from the JTAG target port when in the target mode, the power arbiter setting a flag indicative of the host mode when drawing operating current from the host port, the power arbiter setting a target flag when drawing operating current from the JTAG target port,
wherein the unpowered data-transfer device draws operating current from the host port when in the host mode and draws operating current from the JTAG target port when in the target mode;
wherein the JTAG target port further comprises a plurality of spring-loaded electrically-conductive pins,
wherein the plurality of non-volatile program-memory locations contain instructions that, when executed by the processor, cause the processor to perform operations comprising:
(a) retrieving the target flag and host flag from the power arbiter;
(b) executing instructions associated with host mode if the host flag is set; and,
(c) executing instructions associated with target mode if the target flag is set.

11. The unpowered data-transfer device of claim 10, wherein the plurality of non-volatile program-memory locations contain instructions that, when executed by the processor, cause the processor to perform operations comprising:
(a) receiving, when in the host mode, program data or settings data from the host processor system;
(b) receiving, when in the host mode, target criteria associated with the program data or settings data from the host processor system;

(c) storing, when in the host mode, the program data or settings data and the associated target criteria in a subset of the plurality of non-volatile data-memory locations;
(d) receiving, when in the target mode, the target identifying information from the data-transferable system coupled to the JTAG target port;
(e) retrieving, when in the target mode, target criteria from the plurality of non-volatile data-memory locations;
(f) comparing, when in the target mode, the received target identifying information with the retrieved target criteria to determine a target match;
(g) selecting, when in the target mode, the program data or settings data associated with the matched target; and,
(h) transmitting, when in the target mode, the selected program data or settings data to the data-transferable system coupled to the JTAG target port.

12. The unpowered data-transfer device of claim 10, wherein the plurality of non-volatile program-memory locations contain instructions that, when executed by the processor, cause the processor to perform operations comprising:
(a) receiving, when in the target mode, target data from the data-transferable system coupled to the JTAG target port;
(b) receiving, when in the target mode, the target identifying information associated with the data-transferable system coupled to the JTAG target port;
(c) storing, when in the target mode, the target data and the associated target identifying information in a subset of the plurality of non-volatile data-memory locations;
(d) retrieving, when in the host mode, target data and the associated target identifying information from the plurality of non-volatile data-memory locations; and,
(e) transmitting, when in the host mode, the target data and the associated target identifying information to the host processor system.

13. An unpowered data-transfer device, comprising:
a processor;
a plurality of non-volatile program-memory locations coupled to the processor;
a plurality of non-volatile data-memory locations coupled to the processor;
a host port configured to couple to a host processor system, wherein the unpowered data-transfer device is in a host mode when coupled to the host processor system;
a JTAG (Joint Test Action Group) target port configured to couple to one of a plurality of data-transferable systems each having identifying information, wherein the unpowered data-transfer device is in a target mode when coupled to a data-transferable system;
a power arbiter coupled to both the host port and the JTAG target port, the power arbiter drawing operating current from the host port when in the host mode and drawing operating current from the JTAG target port when in the target mode, the power arbiter setting a flag indicative of the host mode when drawing operating current from the host port, the power arbiter setting a target flag when drawing operating current from the JTAG target port; and,
means for drawing operating current from either the JTAG target port or the host port;
wherein the JTAG target port further comprises a plurality of spring-loaded electrically-conductive pins,
wherein the plurality of non-volatile program-memory locations contain instructions that, when executed by the processor, cause the processor to perform operations comprising:
(a) retrieving the target flag and host flag from the power arbiter;
(b) executing instructions associated with host mode if the host flag is set; and,
(c) executing instructions associated with target mode if the target flag is set.

14. The unpowered data-transfer device of claim 13, wherein the plurality of non-volatile program-memory locations contain instructions that, when executed by the processor, cause the processor to perform operations comprising:
(a) receiving, when in the host mode, program data or settings data from the host processor system;
(b) receiving, when in the host mode, target criteria associated with the program data or settings data from the host processor system;
(c) storing, when in the host mode, the program data or settings data and the associated target criteria in a subset of the plurality of non-volatile data-memory locations;
(d) receiving, when in the target mode, the target identifying information from the data-transferable system coupled to the JTAG target port;
(e) retrieving, when in the target mode, target criteria from the plurality of non-volatile data-memory locations;
(f) comparing, when in the target mode, the received target identifying information with the retrieved target criteria to determine a target match;
(g) selecting, when in the target mode, the program data or settings data associated with the matched target; and,
(h) transmitting, when in the target mode, the selected program data or settings data to the data-transferable system coupled to the JTAG target port.

15. The unpowered data-transfer device of claim 13, wherein the plurality of non-volatile program-memory locations contain instructions that, when executed by the processor, cause the processor to perform operations comprising:
(a) receiving, when in the target mode, target data from the data-transferable system coupled to the JTAG target port;
(b) receiving, when in the target mode, the target identifying information associated with the data-transferable system coupled to the JTAG target port;
(c) storing, when in the target mode, the target data and the associated target identifying information in a subset of the plurality of non-volatile data-memory locations;
(d) retrieving, when in the host mode, target data and the associated target identifying information from the plurality of non-volatile data-memory locations; and,
(e) transmitting, when in the host mode, the target data and the associated target identifying information to the host processor system.

* * * * *